United States Patent
Arimoto

(10) Patent No.: US 7,457,339 B2
(45) Date of Patent: Nov. 25, 2008

(54) SEMICONDUCTOR LASER APPARATUS

(75) Inventor: Hideo Arimoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 449 days.

(21) Appl. No.: 11/068,869

(22) Filed: Mar. 2, 2005

(65) Prior Publication Data
US 2006/0104324 A1 May 18, 2006

(30) Foreign Application Priority Data
Nov. 18, 2004 (JP) .............................. 2004-334676

(51) Int. Cl.
*H01S 5/00* (2006.01)
(52) U.S. Cl. ............. 372/50.11; 372/50.12; 372/50.122
(58) Field of Classification Search ............. 372/43.01, 372/50.1, 50.122, 50.12
See application file for complete search history.

(56) References Cited

U.S. PATENT DOCUMENTS
5,805,755 A * 9/1998 Amersfoort et al. ......... 385/131

OTHER PUBLICATIONS
Naoki Fujiwara et al., "Inherently Mode-Hop-Free Distributed Bragg Reflector (DBR) Laser Array", IEEE Journal of Selected Topics in Quantum Electronics, vol. 9, No. 5 (Sep./Oct. 2003), pp. 1132-1137.*

* cited by examiner

*Primary Examiner*—Minsun Harvey
*Assistant Examiner*—Patrick Stafford
(74) *Attorney, Agent, or Firm*—Reed Smith LLP; Stanley P. Fisher, Esq.; Juan Carlos A. Marquez, Esq.

(57) ABSTRACT

Arrayed DBR (Distributed Bragg Reflector) laser shows a problem that spectrum purity is deteriorated when a current is flowed in a semiconductor optical amplifier for attaining a sufficient optical output. In addition, the arrayed waveguide grating laser shows a problem that the spectrum purity is deteriorated by leakage of light. An output end of each of the laser channels is provided with a gate (a core) that can be controlled through bias application. The gate has a function for amplifying light when the laser channels are operated and for absorbing light when the laser channels are not operated.

16 Claims, 13 Drawing Sheets

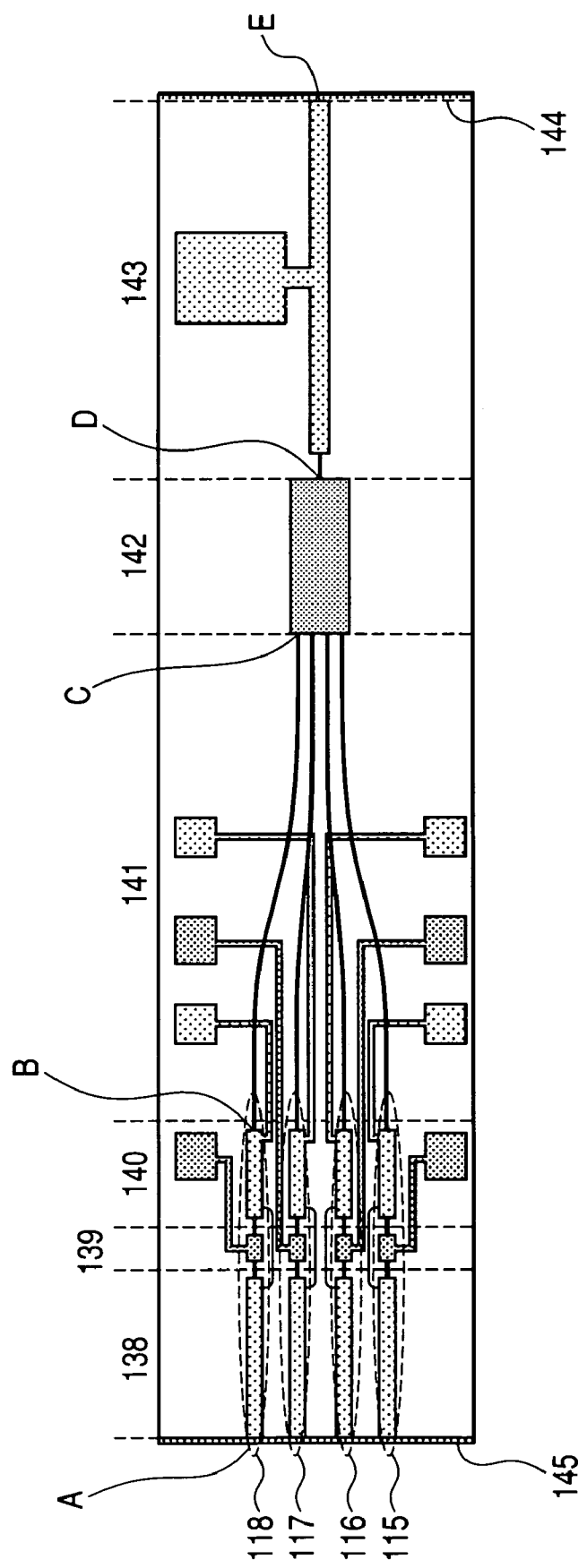

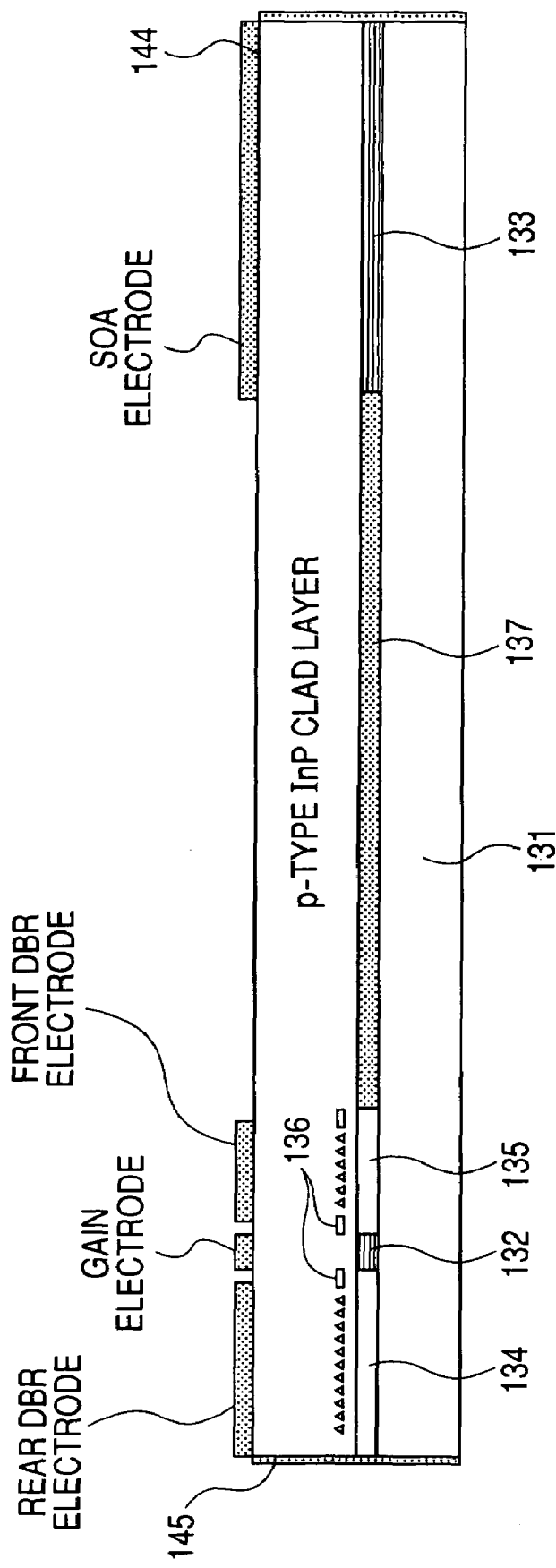

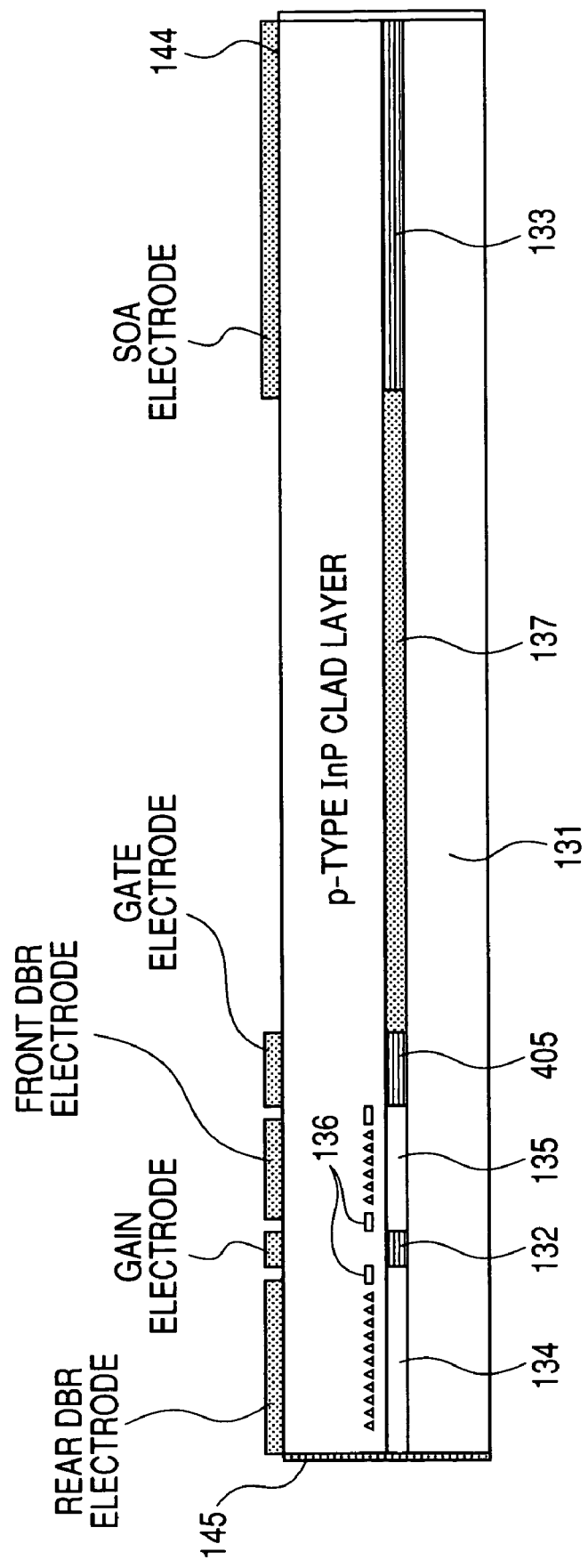

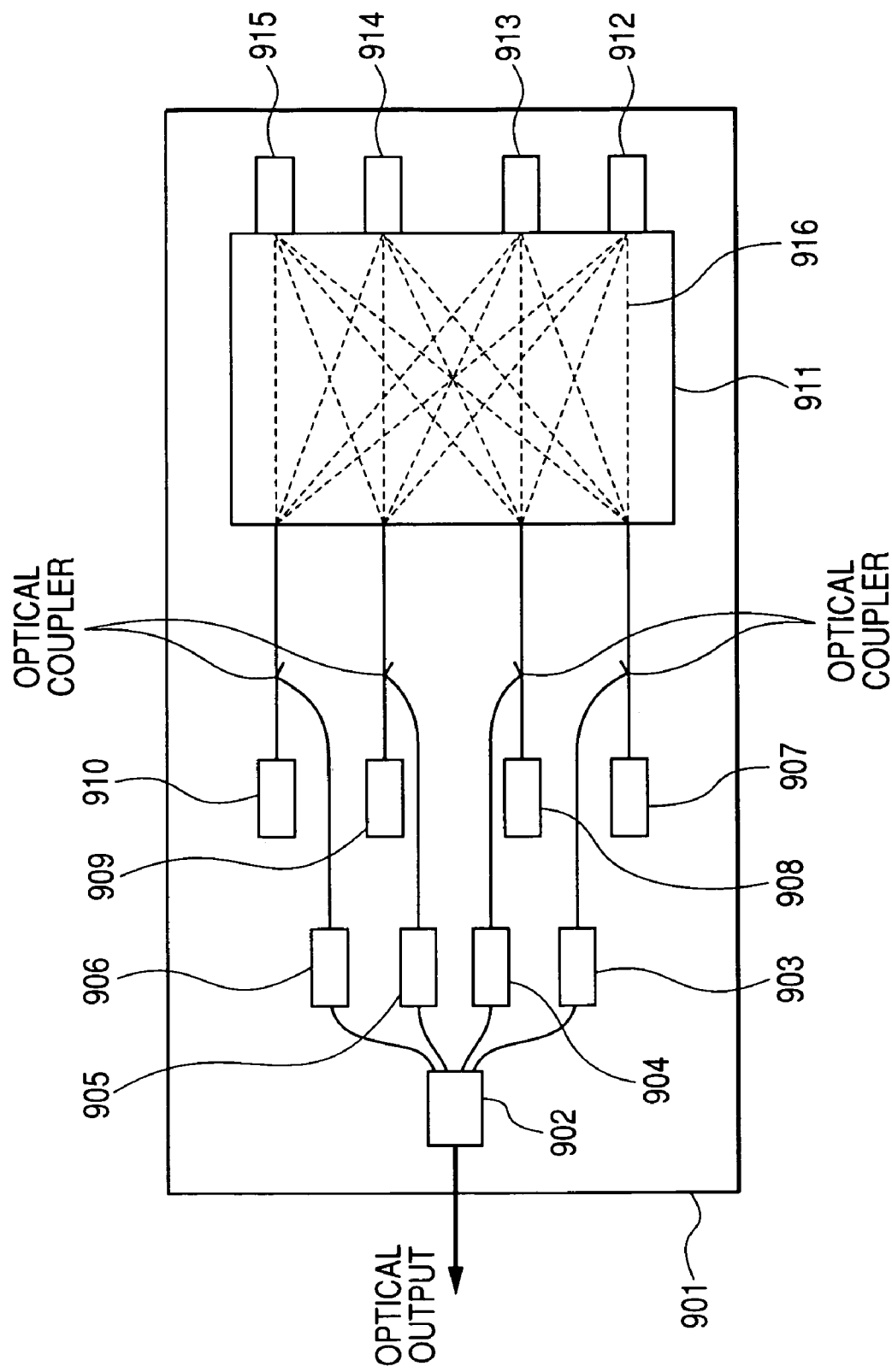

SEMICONDUCTOR LASER APPARATUS

CLAIM OF PRIORITY

The present application claims priority from Japanese Application Serial No. 334676/2004, filed on Nov. 18, 2004, the content of which is hereby incorporated by reference into this application.

BACKGROUND OF THE INVENTION

1. Field of the Invention

The present invention relates to semiconductor laser apparatuses, and more particularly, to an arrayed Distributed Bragg Reflector (DBR)-semiconductor laser apparatus that realizes a tunable semiconductor laser capable of setting any optional wavelength.

2. Description of the Related Art

As tunable lasers capable of optionally setting a wavelength of the entire C-band of wavelength band used in a wavelength division multiplexer (WDM: Wavelength Division Multiplexer) system, DBR lasers having a special diffraction grating such as SG (Sampled Grating), SSG (Super Structure Grating) or the like have been developed. In order to perform laser oscillation at a desired wavelength, DBR lasers needed current control for optical phase adjustment in addition to current control for wavelength adjustment. The control system became complex and additionally it was hard to ensure long-term wavelength durability. In order to overcome the aforesaid problems, a short cavity DBR laser not requiring any optical phase adjustment has been recently developed (refer to "Selected Topics in Quantum Electronics", IEEE Journal, Vol. 9, September/October of 2003, p. 1132-1137, for example). Since the variable range of wavelength per channel in this short cavity DBR laser is limited to 10 nm or less, it is necessary to array a plurality of DBR lasers for covering the entire C-band. As a form for realizing the foregoing arrangement, it has been known in the art to provide a semiconductor laser for combining DBR laser arrays through a multi-mode interferometer (MMI: Multi-Mode Interferometer) and amplifying it through a semiconductor optical amplifier (SOA: Semiconductor Optical Amplifier). FIG. 1 shows an example of a laser chip having the DBR laser arrays, MMI and SOA integrated in monolithic form. The laser chip is made such that gain electrodes 101, 102, 103 and 104, DBR electrodes 105, 106, 107 and 108 and SOA electrode 114 are formed on the surface of an InP substrate 100. A waveguide structure is such that a DBR laser channel ch1 115, a DBR laser channel ch2 116, a DBR laser channel ch3 117, and a DBR laser channel ch4 118 are arranged in parallel to one another, to each of which corresponding one of optical waveguides 109, 110, 111 and 112 is connected on the optical output side. The optical waveguides 109, 110, 111 and 112 are connected to an MMI multiplexer 113, which is further connected to an SOA waveguide below an SOA electrode 114. FIG. 2A is a plan view of the chip shown in FIG. 1. This laser chip includes a rear DBR region 138, a gain region 139, a front DBR region 140, an S-shaped waveguide region 141, an MMI region 142 and an SOA region 143, which are integrated therein. A front end surface 144 and a rear end surface 145 are coated with a low reflection film. FIG. 2B is an ABCDE-sectional view of the chip shown in FIG. 2A. In this case, the ABCDE-section is defined as sections of an optical path ranging from a semiconductor laser shown at the upper-most part in FIG. 2A to a semiconductor optical amplifier through the optical waveguides, a multiplexer for multiplexing the optical waveguides. The DBR laser part is made such that a core layer 132 in the gain region, a refractive index control core layer 134 in the rear DBR region and a refractive index control core layer 135 in the front DBR region are connected to one another. Refractive grating supplying layers 136 are disposed on the refractive index control core layer 134 in the rear DBR region and the refractive index control core layer 135 in the front DBR region. The refractive index control core layer 135 in the front DBR region is connected to a core layer 137 of the low loss optical waveguide, which forms the S-shaped waveguide region 141 and the MMI region 142. Further, the core layer 137 is connected to the core layer 133 in the SOA region.

FIG. 3 shows an example of the wavelength characteristic of the laser chip in FIG. 1. The DBR lasers of 4 channels, ch1, ch2, ch3 and ch4, covers wavelength regions different from one another so as to cover the entire C-band. In order to provide a wavelength of 1540 nm, for example, a current is inputted to the gain layer and SOA layer of ch2 and then a current of 100 mA is inputted to the DBR layer. At this time, no current is allowed to flow in the gain layer and DBR layer of the DBR laser with other channels.

However, when a current is allowed to flow to provide a sufficient optical output, a problem arises of degrading spectrum purity. FIG. 4 shows a spectrum obtained by operating the laser chip in FIG. 1. The laser chip is operated such that the DBR laser channel ch4 118 is selected, a current of 20 mA is inputted to the gain electrode 102, 5 mA to the DBR electrode 106 and 200 mA to the SOA electrode 114. In addition to a main signal 301 of 1560 nm, both background light 302 with a narrow wavelength range and background light 303 with a wide wavelength range are generated, thus, degrading spectrum purity. As a result, an intensity ratio between the main signal and the background light (here, referred to as an SNR: Signal Noise Ratio) is 35 dB, which does not satisfy 40 dB requisite for optical communications in general.

The background light 302 with a narrow wavelength range is probably due to the following: Spontaneous emission light occurring upon application of a current to the core layer 133 in the SOA region passes through the MMI region 142 and the S-shaped waveguide region 141. Then, it reaches the refractive index control core layer 135 in the front DBR region in each of the DBR laser channels. Each of the front DBR refractive index control layers 135 of the DBR laser channels reflects spontaneous emission light. The reflected light is returned back to the core layer 133 in the SOA region, amplified there and then the amplified light is output from the end surface 144. In addition, the background light 303 with a wide wavelength range is probably due to the following: Intensity of signal light inputted to the core layer 133 in the SOA region is weak because signal light generated by the DBR laser 118 is lost at the MMI. This leads to a large amount of current not used for amplifying the inputted light. This surplus current generates the background light 303 with a wide wavelength range.

SUMMARY OF THE INVENTION

The foregoing discussion makes it clear that it is necessary to suppress the reflection at the front DBR region 140 so as to minimize the background light 302 with a narrow wavelength range. In addition, it is necessary to improve intensity of signal light generated by the DBR laser so as to minimize the background light 303 with a wide wavelength range. To meet the necessities, as shown in FIG. 5, the core layer 405 in the gate region (not referred sometimes to as a gate region specifically, but as a core layer in the claims and the present specification) and gate electrodes 401, 402, 403 and 404 are added at the emitting end surfaces of the DBR laser channels to the prior art configuration. This gate increases an optical output by applying current thereto to make the gate serving as a semiconductor optical amplifier when the laser channel is operated. When the DBR laser channel is not operated, the gate provides the following function by applying no current to the gate: The light is absorbed at the gate, the spontaneous emission light from the core layer 133 in the SOA region is reflected at the refractive index control core layer 135 in the front DBR region so as to prevent the light from being returned back to the core layer 133 in the SOA region. As a result, a laser operation with improved spectrum purity is accomplished.

Then, referring to FIGS. 6A and 6B, a more practical configuration and controlling method will be described. A band-gap value at the core layer 133 in the SOA region is defined as $E_{SOA}$, an energy value of the signal light from the DBR laser channel ch1 (115) as $E_{sig1}$, and a band-gap value of the core layer 405 in the first gate region optically connected to the DBR laser channel ch1 (115) as $E_1$. When the DBR laser channel ch1 (115) is not operated (no signal light is outputted), light from the SOA is absorbed at the core layer in the first gate region with a relation of $E_{SOA}>E_1$. In addition, when the DBR laser channel ch1 (115) is operated, a relation of $E_{SIG1}>E_1$ is established, and then signal light from the DBR laser channel ch1 (115) is amplified by inputting a current to the core layer 405 in the first gate region through the gate electrode. Further, an energy value of the signal light from the DBR laser channel ch2 (116) is defined as $E_{sig2}$, and a band-gap value at the core layer 405 in the second gate region optically connected to the DBR laser channel ch2 (116) is defined as $E_2$. When the DBR laser channel ch2 (116) is not operated (no signal light is outputted), light from the DBR is absorbed at the core layer in the second gate region under a relation of $E_{SOA}>E_2$. When the DBR laser channel ch2 (116) is operated, a relation of $E_{SIG2}>E_2$ is established, and signal light from the DBR laser channel ch2 (116) is amplified by inputting an current to the core layer 405 in the second gate region through the gate electrode.

Then, a controlling method will be described below. When the DBR laser channel ch1 (115) is operated, the first gate region is operated to amplify the signal light and the second gate region is operated to absorb light from the SOA. To the contrary, when the DBR laser channel ch2 (116) is operated, the second gate region is operated to amplify the signal light, the first gate region is operated to absorb light from the SOA. The aforesaid configuration and control accomplishes the laser operation with improved spectrum purity.

There has been described up to now of a case where when the DBR laser channel ch1 (115) is operated, the first gate region amplifies the signal light from the DBR laser channel ch1 (115) and when the DBR laser channel ch2 (116) is operated, the second gate region amplifies the signal light from the DBR laser channel ch2 (116). However, it is not necessarily required for the gate region to amplify the signal light, but the gate region is needed only to allow signal light to pass therethrough without any loss. A practical configuration and controlling method of a system different from those of the foregoing will be described below.

When the DBR laser channel ch1 (115) is not operated (no signal light is outputted), light from the SOA is absorbed at the core layer in the first gate region with a relation of $E_{SOA}>E_1$. When the DBR laser channel ch1 (115) is operated (signal light is outputted), a relation of $E_{SIG1}<E_1$ is established and the signal light from the DBR laser channel ch1 (115) is allowed to pass. An amplifying action at the core layer is not substantially carried out. Further, when the DBR laser channel ch2 (116) is not operated, a relation of $E_{SOA}>E_2$ is established, and light from the SOA is absorbed at the core layer in the second gate region. When the DBR laser channel ch2 (116) is operated, a relation of $E_{SIG2}<E_2$ is established, and the signal light from the DBR laser channel ch2 (116) is allowed to pass. Also in this case, no amplifying action is substantially found at the core layer. A controlling method is the same as that found when the aforesaid gate region performs the amplifying operation. Such a configuration and controlling method described above accomplish a laser operation with improved spectrum purity.

Both the aforesaid cases have a problem in that as a gate electrode is increased in number, the number of control electrodes is increased, which complicates control. Since current is inevitably allowed to flow the gain electrode and gate electrode of the operating DBR channel simultaneously, the gain electrode and the gate electrode can be used in common, whereby the present number of electrodes can be maintained.

In addition, also when the gate layer is not especially installed, it is possible to improve spectrum purity by minus-biasing the front DBR region 140 when the DBR laser channel is not operated, thereby absorbing the spontaneous emission light from the core layer 133 in the SOA region into the DBR layer to prevent its reflection.

Additionally, if the DBR laser, gate region, optical waveguide, multiplexer and SOA are integrated as a monolithic, the apparatus more preferably becomes small in size.

In general, since the substrate is set to a ground potential, and the first and second gate regions are each provided with an electrode, associated components can be controlled.

In addition, the respective core layers of the first and second gate regions may each be a multiple quantum wells layer or a bulk layer.

The DBR laser has been described so far by way of example. Examples of more commonly used laser apparatuses include one which has a laser with a plurality of channels, an optical multiplexer for multiplexing the output beams from the plural channel laser, and an optical waveguide for connecting the output end of the plural channel laser with the optical multiplexer. In this laser apparatus, it is possible to attain a similar effect of improving a spectral purity by mounting a gate in the waveguides to be connected.

Although there has been described up to now the case of two lasers, if the number of lasers were plural, the number of lasers is not limited. Four lasers may be applicable as indicated in the preferred embodiment of the present invention. When one laser outputs signal light, the other lasers are controlled not to output any signal light. When one laser outputs a signal light, the core layer connected to the laser is merely controlled to transmit the signal light therethrough or to amplify the signal light. At this time, an individual core layer connected to the other laser (one or a plurality of lasers) is controlled to absorb light from the semiconductor amplifier.

The semiconductor laser apparatus of the preferred embodiment of the present invention enables a tunable laser that has high spectral purity and is operated with high-output to be realized by an easy process. The preferred embodiment of the present invention remarkably improves element performance and yields. In addition, an optical communication system to which the semiconductor laser apparatus is applied is easily realized to have a lower price, a large capacity and a long distance operation.

BRIEF DESCRIPTION OF THE DRAWINGS

FIG. 2A is a plan view of the laser chip shown in FIG. 1;

FIG. 2B is a cross-sectional view of the laser chip shown in FIG. 1;

FIG. 6B is a cross-sectional view of the laser chip shown in FIG. 5;

FIG. 11 is a configuration view for showing the semiconductor laser in accordance with the preferred embodiment of the present invention.

DESCRIPTION OF THE PREFERRED EMBODIMENTS

The preferred embodiments of the present invention will be described in detail below.

Embodiment 1

Figure 5:
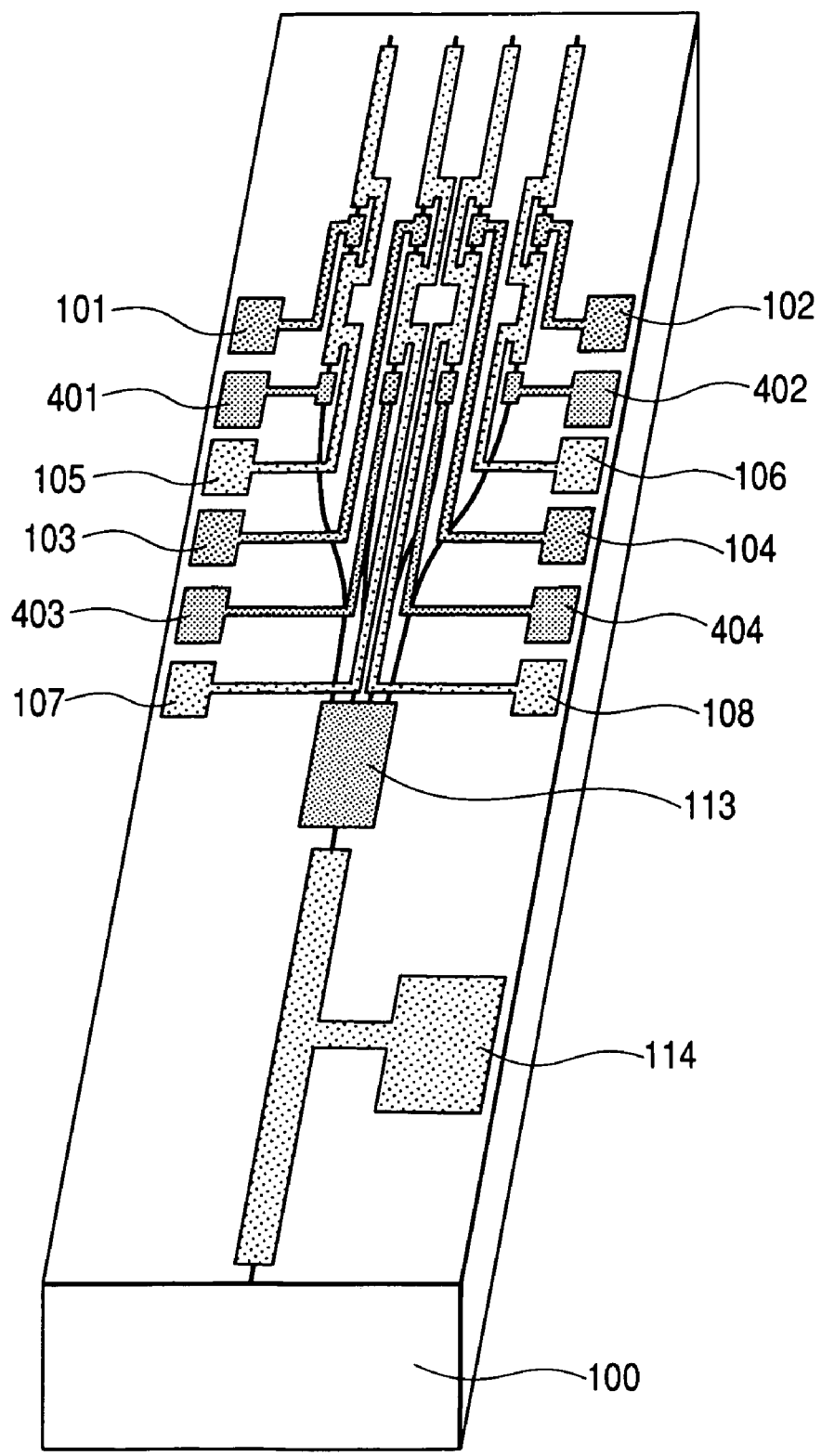
FIG. 5 is a perspective view of a laser chip based on the present invention.
Figure 6A:
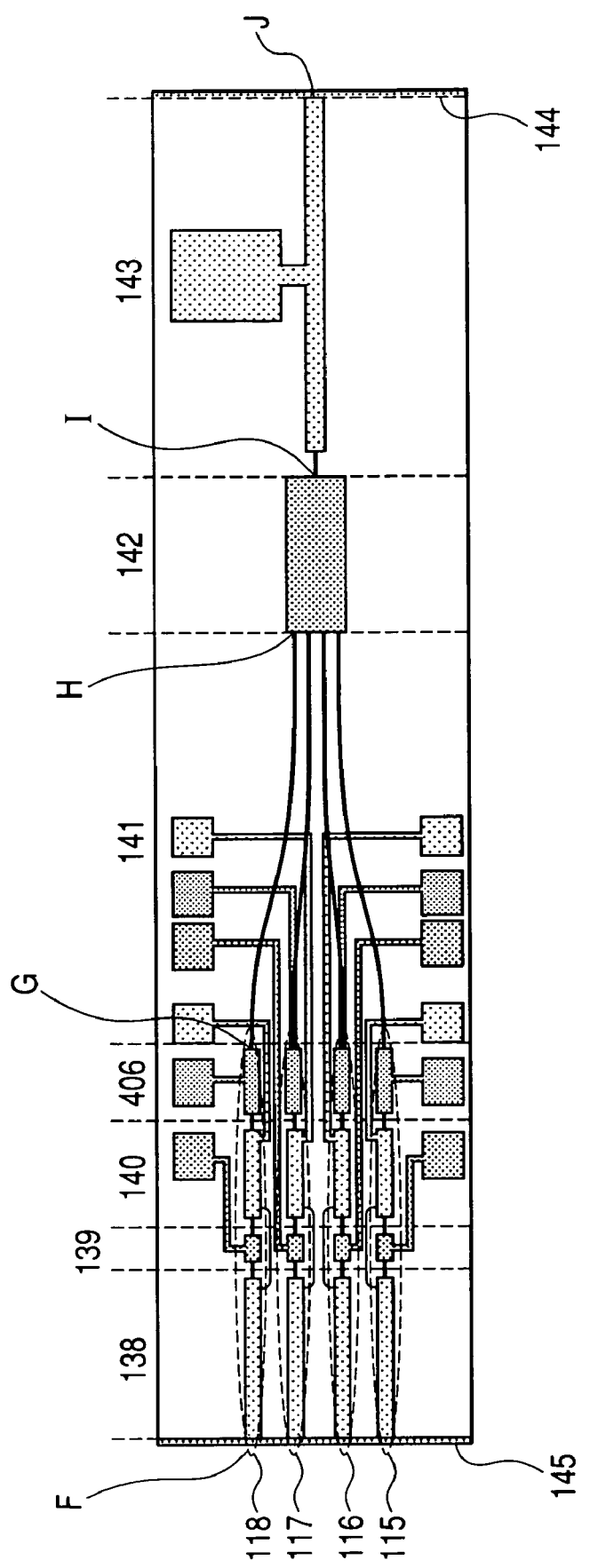
FIG. 6A is a plan view of the laser chip shown in FIG. 5.

FIGS. 5, 6A and 6B illustrate an example of a semiconductor laser with a 1550-nm-band according to the prevent invention. This semiconductor laser has a capability to change an oscillation wavelength by inputting a current to a refractive index control layer and selecting a DBR laser channel. FIG. 5 is a perspective view, FIG. 6A is a top plan view, and FIG. 6B is an FGHIJ-sectional view of the chip shown in FIG. 6A. The FGHIJ-section is defined as sections of an optical path ranging from a semiconductor laser shown at the upper-most part of FIG. 6A to a semiconductor optical amplifier through gate areas, optical waveguides, a multiplexer for multiplexing the optical waveguides. A channel DBR laser array, an MMI multiplexer and an SOA are integrated as a monolithic A method for manufacturing the laser apparatus will be described below. A core layer 132 in a gain region, a core layer 133 in an SOA region and a core layer 405 in a gate region are grown on an n-type (100) InP semiconductor substrate 131 by an organic metal vapor phase epitaxy. The core layers are made of a strain InGaAsP material, and composed of multiple quantum wells with 10 periods. A light-emitting wavelength of the multiple quantum wells is about 1550 nm. Later, the core layer 132 becomes a core layer in the gain region of the DBR laser, the core layer 405 becomes a core layer in the gate region and the core layer 133 becomes a core layer in the SOA region. Subsequently, a refractive index control core layer 134 in the InGaAsP (a composition wavelength of 1.40 μm) rear DBR region with a thickness of 0.4 μm, a refractive index control core layer 135 in the front DBR region and an InGaAsP (a composition wavelength of 1.3 μm) diffraction grating supply layers 136 with a thickness of 50 nm are formed in sequence by an organic metal vapor phase epitaxy using the well-known selective etching and a direct coupling technology for different waveguides. Then, a uniform diffraction grating is printed on the diffraction grating supply layers 136 by the well-known process. Diffraction grating periods are set to 236.6, 238.1, 239.7 and 241.2 nm so as to obtain different oscillation wavelengths at the DBR laser channels ch1 (115), ch2 (116), ch3 (117) and ch4 (118), respectively. In addition, the periods of the laser channels in the rear DBR region are made the same as those in the front DBR region. Subsequently, while the refractive index control core layer 134 in the rear DBR region, the core layer 132 in the gain region, the refractive index control layer 135 in the front DBR region, the core layer 405 in the gate region and the core layer 133 in the SOA region are protected using the well-known selective etching process and the direct coupling technology for different waveguides, a core layer 137 in the InGaAsP (a composition wavelength of 1.3 μm) low loss optical waveguide is formed in sequence by an organic metal vapor phase epitaxy. Then, a p-type InP clad layer with a thickness of 1.5 μm and a high density p-type InGaAs cap layer with a thickness of 0.2 μm are formed in sequence by an organic metal vapor phase epitaxy.

Then, the waveguide is formed by the well-known selective dry etching technology using an insulation stripe shaped mask. Subsequently it is selectively implanted with Fe-doped InP by the organic metal vapor phase epitaxy. A mesa width is 1.3 μm. A rear DBR region 138, a gain region 139, a front DBR region 140, a gate region 406, an S-shaped waveguide region 141, an MMI region 142 and an SOA region 143 are formed to have lengths of 300, 35, 120, 100, 500, 200 and 600 μm, respectively. A separation region of 5 μm is disposed between each region. The entire laser chip has a length of 2,000 μm. Thereafter, electrodes are provided on the front surface of the chip so as to supply current to the regions as shown in FIG. 6A. A common electrode is provided on the rear surface of the chip. After the chip is cut into a laser chip length of 2,000 μm, the front end surface 144 and rear end surface 145 of the laser chip are each formed with a low reflection film with a reflectance of 0.01%.

Figure 1:
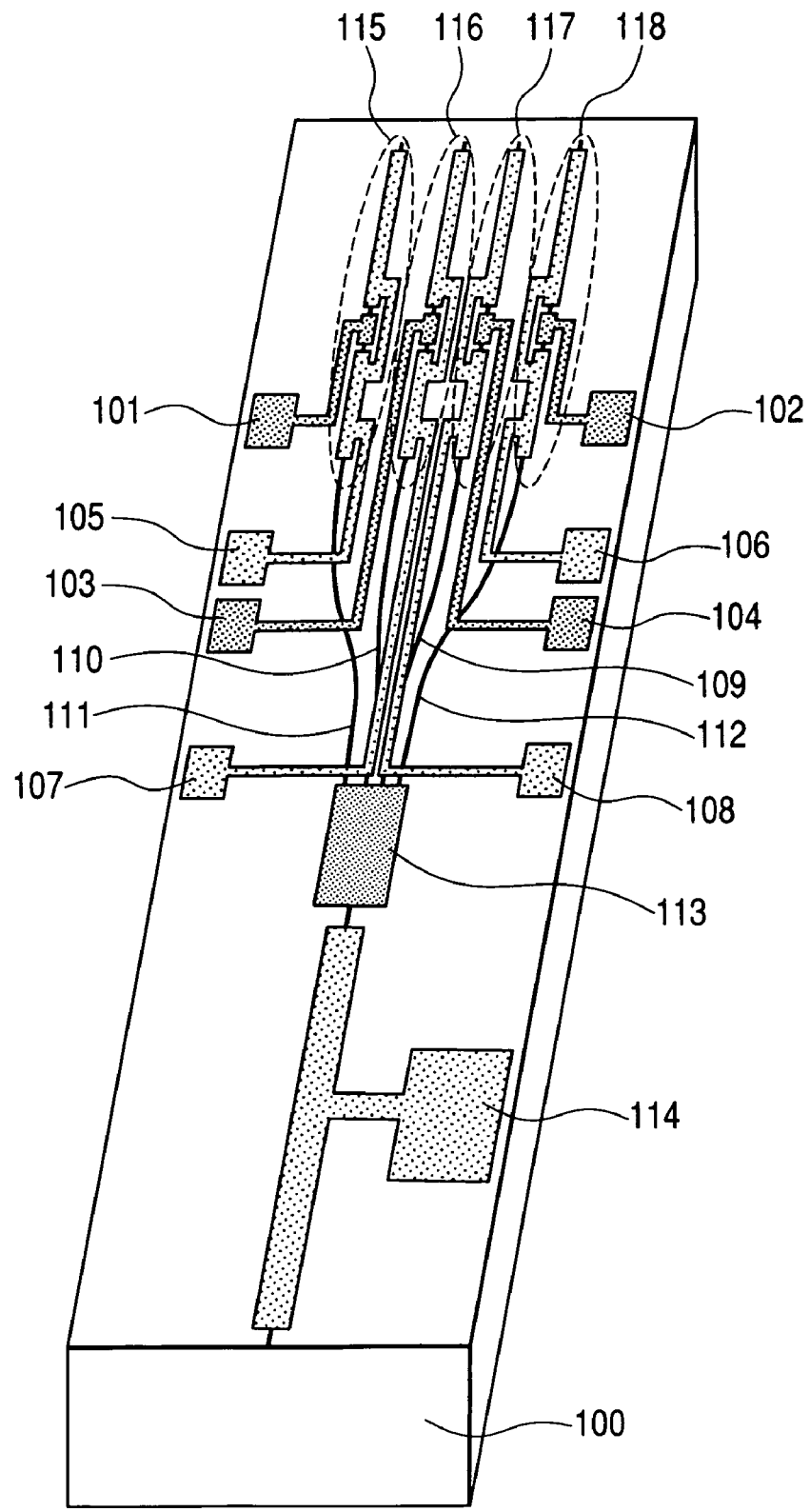
FIG. 1 is a perspective of a laser chip having a DBR laser array, MMI and SOA integrated as a monolithic.
Figure 3:
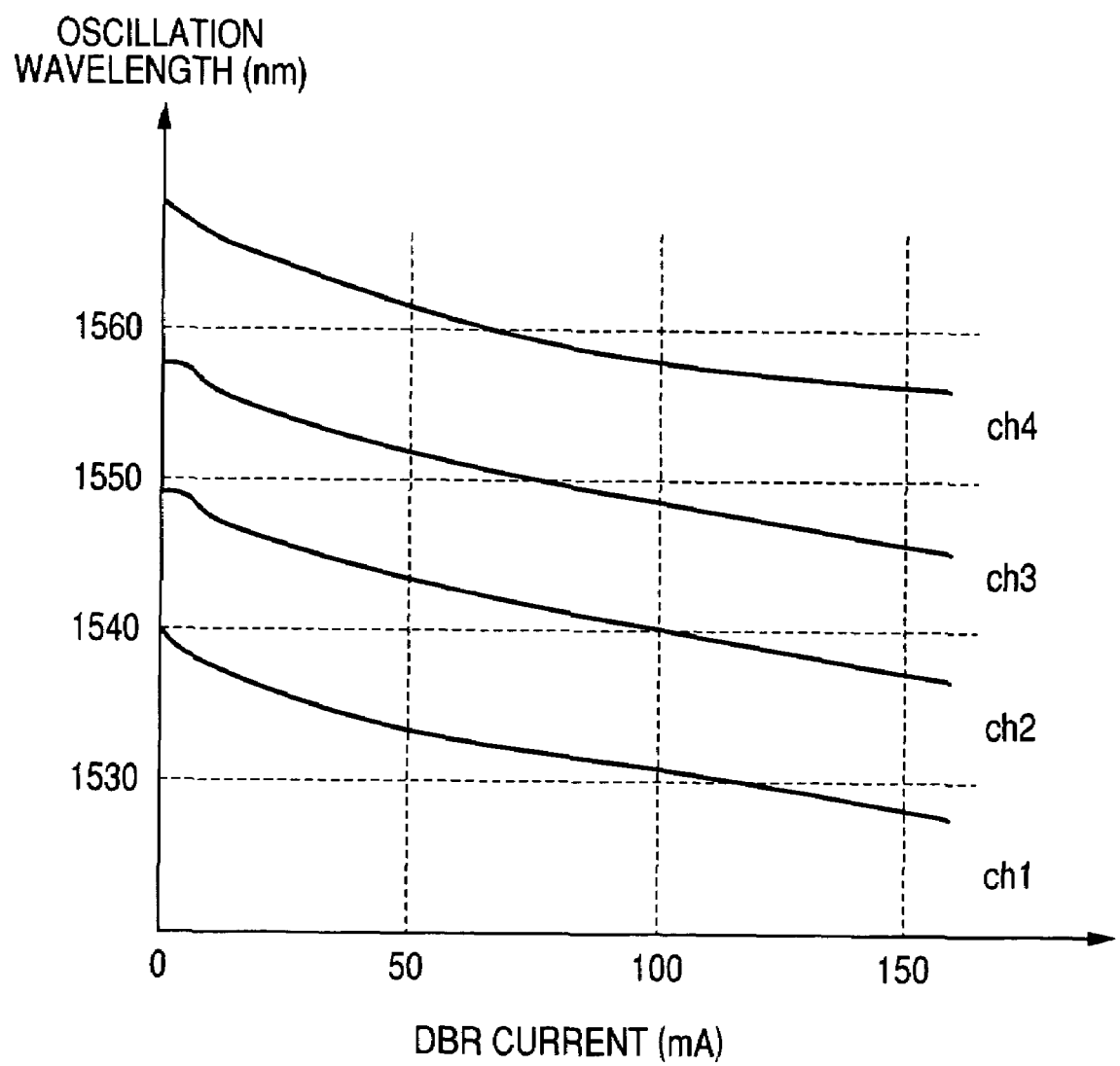
FIG. 3 shows an example of the wavelength characteristics of the laser chip shown in FIG. 1.
Figure 4:
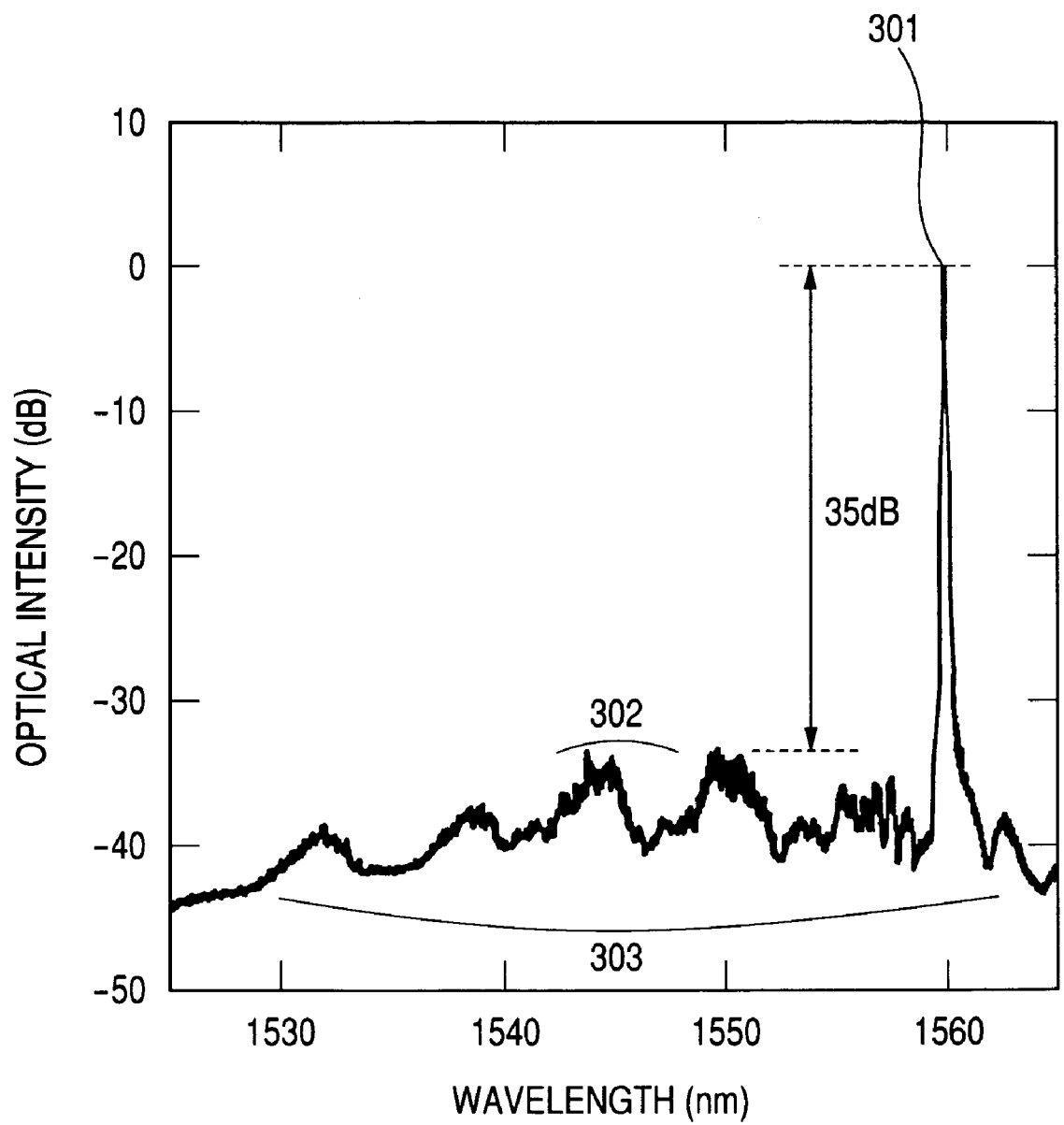
FIG. 4 shows an example of a spectrum of the laser chip shown in FIG. 1.

The distribution reflection type laser manufactured exhibited single mode oscillation with a 1550-nm-band at each of the four channels. In addition, this laser provided an output sufficient for an optical communication use with a chip light output of about 30 mW by use of a gain current of 20 mA, gate current of 50 mA and SOA layer current of 200 mA. As shown in FIG. 3, the laser provides as wide as a wavelength range of 1530 to 1570 nm by changing the DBR current and selecting the operating laser channel. An SNR at this time is 40 dB or more, which a sufficient value for the optical communication use.

Figure 7:
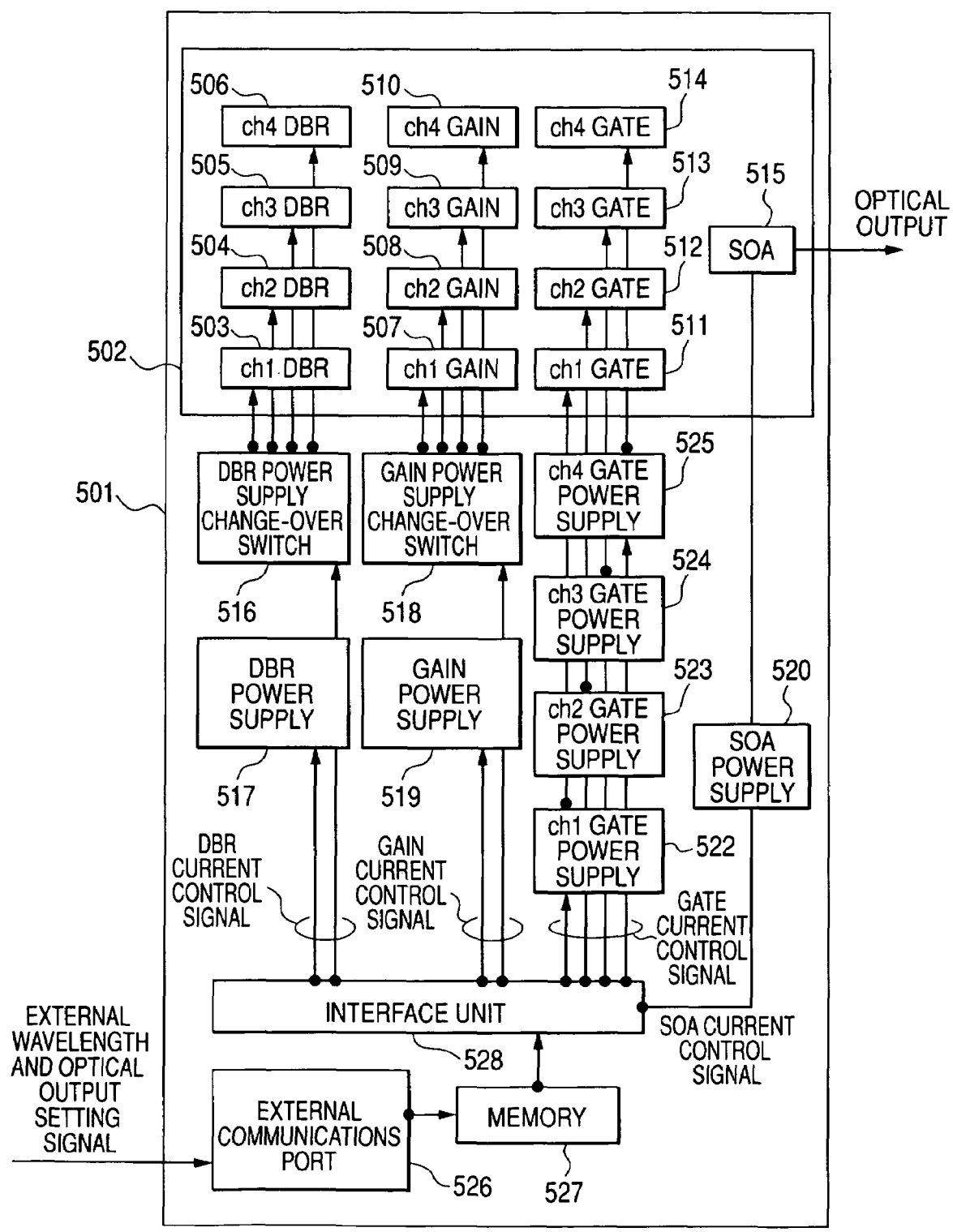
FIG. 7 is a block diagram for showing the configuration of a semiconductor laser apparatus in accordance with a preferred embodiment of the present invention.

Then, a controlling method will be described below. FIG. 7 shows a block diagram illustrating a configuration of a semiconductor laser apparatus according to the present invention. A tunable laser chip 502 is mounted in a semiconductor laser apparatus 501. DBR layer electrodes 503-506, gain layer electrodes 507-510, gate layer electrodes 511-514 and an SOA electrode 515 are formed on the tunable laser chip 502. In addition, this apparatus includes: a DBR power supply change-over switch 516 for selecting a DBR laser channel to input a wavelength adjustment current; a DBR power supply 517; a gain current change-over switch 518 for selecting a channel to input a gain current; a gain power supply 519; gate power supplies 522-525; an external communications port 526; an internal memory 527; and an interface 528.

A wavelength and optical output setting signal from the outside is inputted to the external communication port 526 and transferred to the internal memory 527 having a look-up table. The internal memory 527 sets the operating DBR laser channel, a DBR current and a gain current in response to the wavelength and optical output setting signal. In response to the setting of the internal memory, the DBR power supply 517 and the gain power supply 519 each generate a current, and the DBR power supply change-over switch 516 and the gain power. supply change-over switch 518 each select an electrode. In addition, the internal memory determines an SOA current in response to an optical output set signal and then the SOA power supply 520 generates a current. The gate power supplies 522, 523, 524 and 525 are operated such that a current is inputted from the gain power supply 519 to the operating DBR laser channel, and the remaining three channels not operated are short circuited or minus-biased to absorb the spontaneous emission light from the SOA.

It becomes possible to install the semiconductor laser apparatus of the present invention in a small-sized module because the controlling method of this configuration is simplified.

Although the foregoing description relates to the DBR laser array having four channels, the number of channels may be 2 or more, e.g., 6, 8 or 10. Additionally, as a typical preferred embodiment of the present invention, the buried laser structure using materials of InGaAsP has been described. The present invention can be similarly applied to all the semiconductor laser materials such as InGaAlAs, GaInNAs, InGaAs, InGaAlP and the like. In addition, the present invention can be applied similarly not only to the buried type laser apparatus, but also to the apparatus using the so-called ridge waveguide structure or a buried ridge structure. Additionally, although the wavelength band is a 1550-nm-band, it may also be a 1300-nm-band, which is frequently used for communications. Further, although the DBR laser array has been described, a distributed feedback (DFB: Distributed Feedback) laser array may be applied.

Embodiment 2

Figure 8:
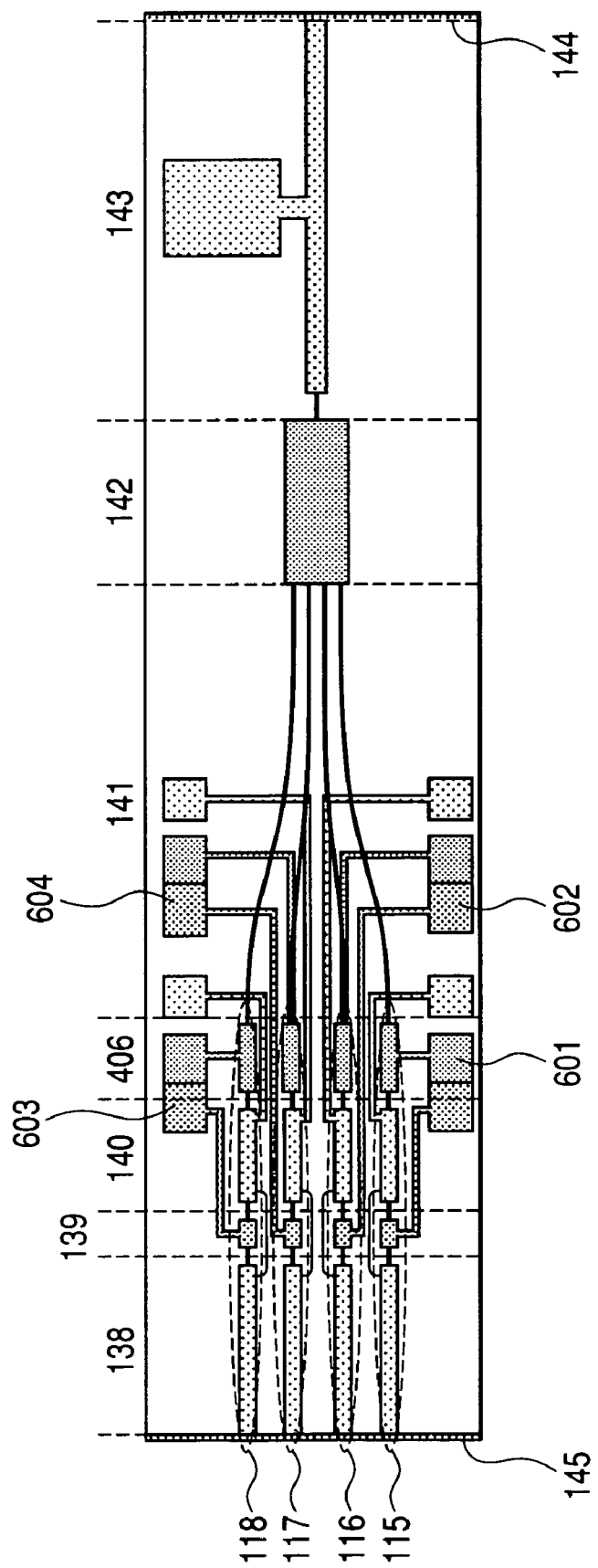
FIG. 8 is a plan view of the laser chip in accordance with the embodiment of the present invention.
Figure 9:
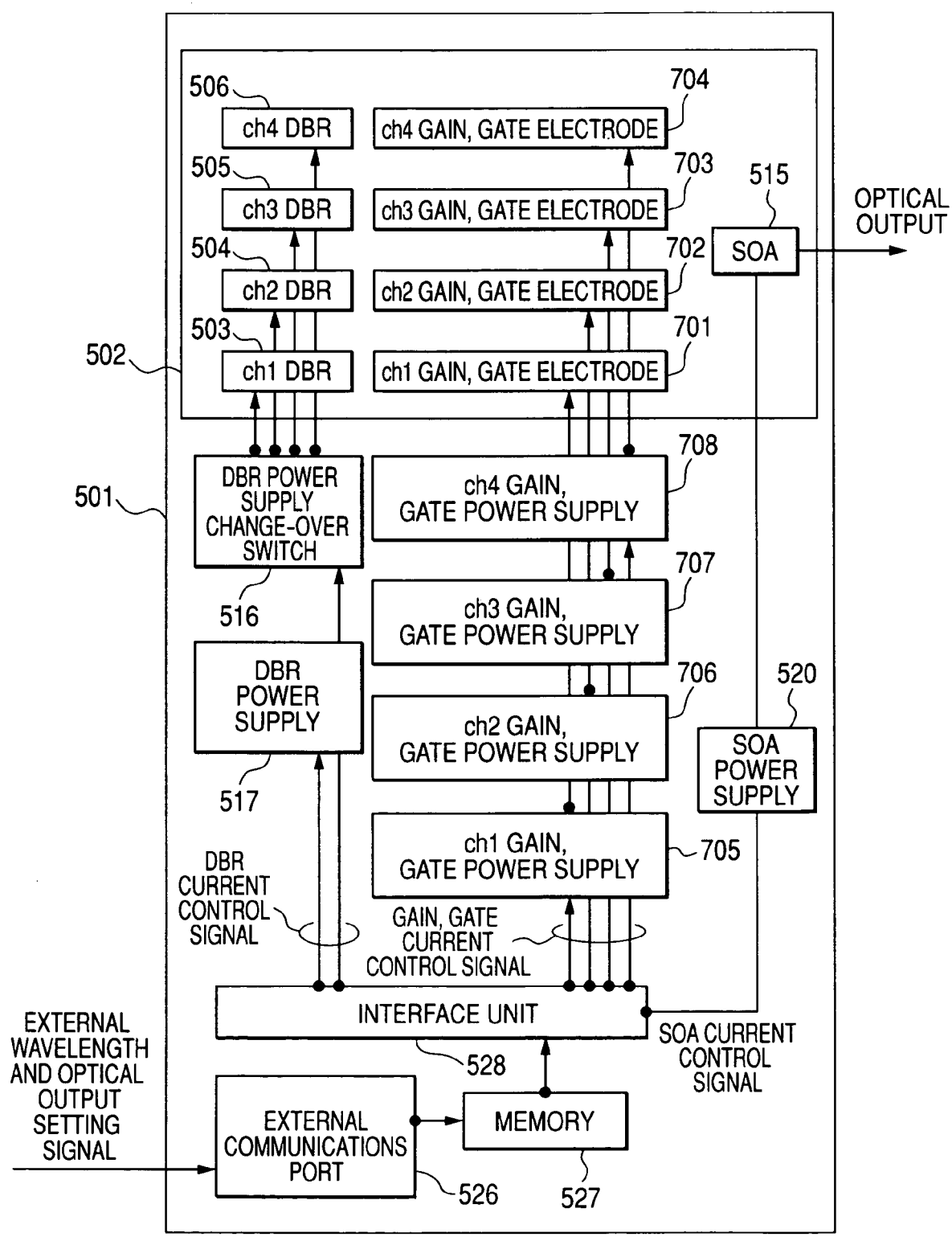
FIG. 9 is a block diagram for showing a configuration of the semiconductor laser apparatus based on the present invention.

FIG. 8 illustrates an example of a semiconductor laser manufactured with a band of 1550 nm in which a gain electrode and a gate electrode are used in common for each DBR laser channel. The laser in FIG. 8 is different from that in FIG. 7 in that a gain electrode and a gate electrode are used in common for each DBR laser channel, that is, gain and gate common electrodes 601, 602, 603 and 604 are formed. In the first embodiment, the number of the gate electrodes is increased, but a current is allowed to flow the gain electrode and gate electrode of a DBR channel that is inevitably operated, which makes it possible to use the gate electrode in common with the gain electrode. At this time, the current number of the electrodes can therefore be maintained. FIG. 9 illustrates a block diagram for showing a configuration of the semiconductor laser apparatus in reference to FIG. 8. As the gain electrode and the gate electrode are used in common, the gain power supply and the gate power supply are made in common. In other words, gate and gate common power electrodes 701, 702, 703 and 704 are installed and concurrently gain and gate common power supplies 705, 706, 707 and 708 are installed.

An external wavelength and optical output setting signal is inputted to an external communication port 526 and transferred to an internal memory 527 having a look-up table. The internal memory sets a DBR laser channel to be operated, a DBR current, a gain current and a gate current in response to the wavelength-setting signal. The DBR power supply 517 generates a current according to the settings of the internal memory, and the DBR power supply change-over switch 516 selects an electrode. In addition, the internal memory determines the SOA current in response to the optical output-setting signal, and the SOA power supply 520 generates a current. A current is supplied from the gain and gate power supply to the gain and gate layers in the DBR laser channel to be operated, and the gain and gate layers in the remaining three channels not to be operated are short circuited or minus-biased.

The DBR laser manufactured oscillated in a single mode with a 1550-nm-band at each of the four channels. The laser obtained the sufficient output, an optical output of about 30 mW, for optical communication use by use of the sum of a gain current and gate current of 70 mA and the SOA current of 200 mA. As shown in FIG. 3, the laser provides as wide as a wavelength range of 1530 to 1570 nm by changing the DBR current and selecting the operating laser channel. An SNR at this time is 40 dB or more, which a sufficient value for the optical communication use.

Embodiment 3

Figure 10:
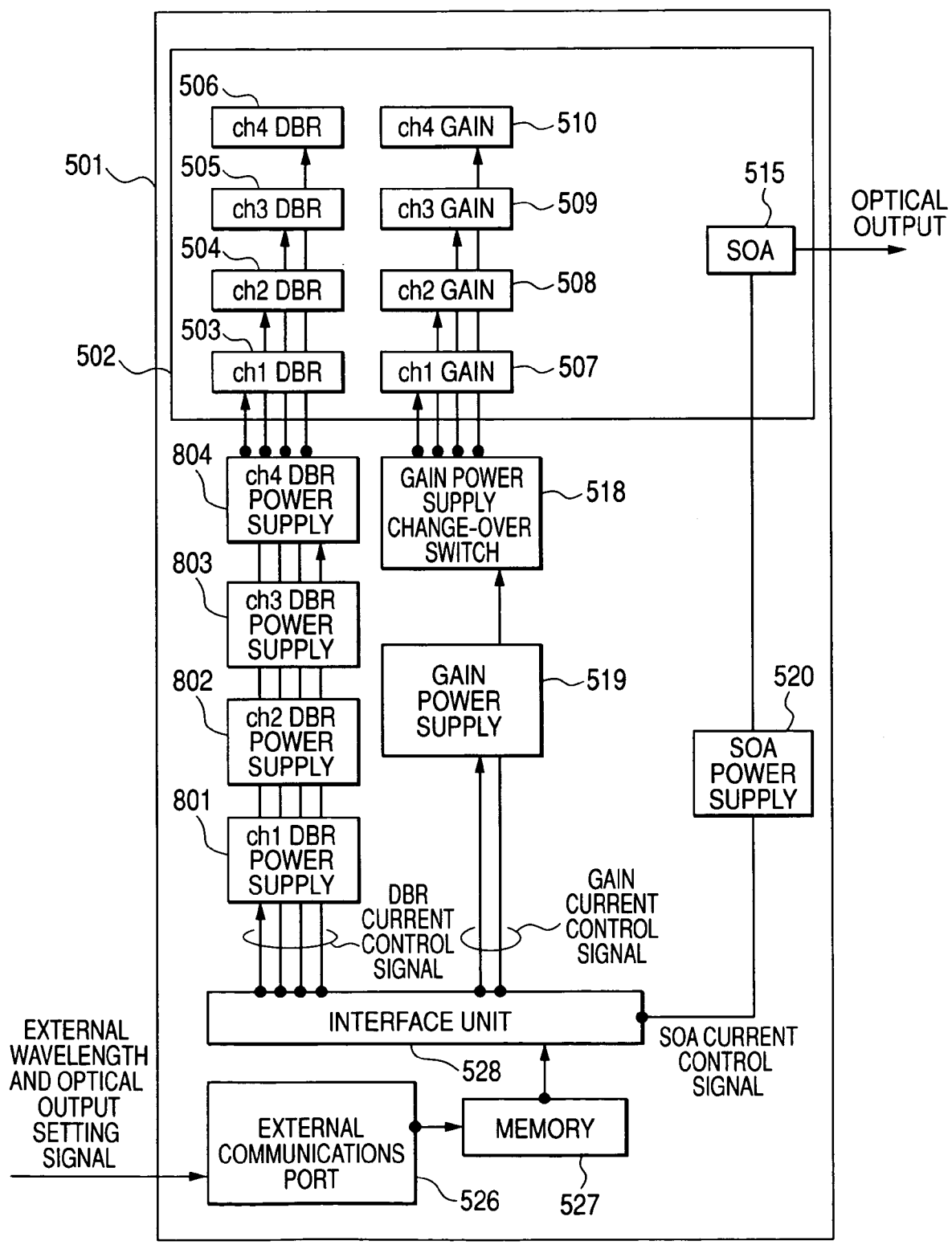
FIG. 10 is a block diagram for showing a configuration of the semiconductor laser apparatus based on the present invention.

FIG. 10 is a block diagram for illustrating a configuration of a semiconductor laser apparatus that improves an SNR by modifying the controlling method by use of the prior art laser chip with a 1550-nm-band (having no gate layer). In this configuration, the DBR electrodes of three channels not operated are minus-biased and the bandgap of the DBR layer is enlarged in wavelength. Thus, spontaneous emission light from a core layer 133 of an SOA region is absorbed, thereby improving spectral purity. In this configuration, the DBR power supplies 801, 802, 803 and 804 are installed.

An external wavelength and optical output setting signal is inputted to an external communication port 506 and transferred to an internal memory 527 having a look-up table. The internal memory sets a gain current in response to the wavelength-setting signal. The internal memory determines an SOA current in accordance with the optical output setting signal so that an SOA power supply 520 generates a current. The DBR power supply of an operating channel generates a predetermined current in response to a setting of the internal memory. The DBR power supplies for the other three channels not operated generate a minus-bias (e.g., −10 V).

The DBR laser manufactured oscillated in a single mode with a 1550-nm-band at each of the four channels. The laser obtained the sufficient output, a optical output of about 30 mW, for optical communication use by use of the sum of a gain current and gate current of 70 mA and the SOA current of 200 mA. As shown in FIG. 3, the laser provides as wide as a wavelength range of 1530 to 1570 nm by changing the DBR current and selecting the operating laser channel. An SNR at this time is 40 dB or more, which a sufficient value for the optical communication use.

Embodiment 4

This embodiment corresponds to a case where the first embodiment is generalized so that a gate structure is useful in improving spectral purity. A semiconductor laser apparatus is configured to include a laser with a plurality of channels, an optical multiplexer for multiplexing the output beams from the plural channel laser, and an optical waveguide for connecting the output end of the plural channel laser with the optical multiplexer.

A tunable laser with sixteen tunable arrayed waveguide gratings (AWG: Arrayed Waveguide Grating) is shown as an example of the aforesaid structure. FIG. 11 illustrates a configuration of a laser where a gate electrode is added to the tunable AWG laser. A tunable AWG laser 901 includes a multiplexer 902, gate electrodes 903, 904, 905 and 906, front gain electrodes 907, 908, 909 and 910, a 4×4 AWG 911 and rear gain electrodes 912, 913, 914 and 915. Its operating principle will be described below. For example, when a current is inputted to the front gain electrode 907 and the rear gain electrode 912, laser oscillation occurs through the 4×4 AWG 911. In this case, the AWG has wavelength selectivity, whereas the front gain electrode 907 and the rear gain electrode 912 cause only light with a certain specified wavelength to pass therethrough. Thus, a single mode oscillation occurs at a specific wavelength. Part of the oscillation light is taken out through the optical coupler and outputted through the gate electrode 906 and the multiplexer 902. At this time, there occurs a problem in that spontaneous emission light from the front gain electrode 907 and the rear gain electrode 915 leaks into the other channels of the AWG, outputted through the other channels, deteriorating the SNR of the signal light. To prevent this problem, the gate electrodes 904, 905 and 906 not related to the oscillation are short circuited or minus-biased, thus, preventing the spontaneous emission light from being outputted.

The tunable arrayed waveguide grating laser oscillated in a single mode at each of the sixteen wavelengths with a 1550-nm-band. An SNR at this time was 40 dB or more, which is a sufficient value for optical communication use.

A description of reference numerals used in the drawings of the present application is as follows:
100: InP substrate
101, 102, 103, 104: gain electrode
105, 106, 107, 108: DBR electrode
109, 110, 111, 112: optical waveguide
113: MMI multiplexer
114: SOA electrode
115: DBR laser channel ch1
116: DBR laser channel ch2
117: DBR laser channel ch3
118: DBR laser channel ch4
131: n-type (100) InP semiconductor substrate
132: core layer in the gain region
133: core layer in the SOA region
134: refractive index control core layer in the rear DBR region
135: refractive index control core layer in the front DBR region
136: diffractive grating supplying layer
137: core layer in the low loss optical waveguide
138: rear DBR region
139: gain region
140: front DBR region
141: S-shaped waveguide region
142: MMI region
143: SOA region
144: front end surface
145: rear end surface
301: major signal
302: background light of narrow wavelength range
303: background light of wide wavelength range
401, 402, 403, 404: gate electrode
405: core layer in the gate region
406: gate region
501: semiconductor laser apparatus
502: tunable laser chip
503-506: DBR electrode
507-510: gain electrode
511-514: gate electrode
515: SOA electrode
516: DBR power supply change-over switch
517: DBR power supply
518: gain power supply change-over switch
519: gain power supply
522-525: gate power supply
526: external communications port
527: internal memory
528: interface unit
601, 602, 603, 604: gain and gate common electrode
701, 702, 703, 704: gain and gate common electrode
705, 706, 707, 708: gain and gate common power supply
801, 802, 803, 804: DBR power supply
901: tunable wavelength AWG laser
902: multiplexer
903, 904, 905, 906: gate electrode
907, 908, 909, 910: front gain electrode
911: 4×4 AWG
912, 913, 914, 915: rear gain electrode
916: optical path in AWG

What is claimed is:

1. A semiconductor laser apparatus comprising:
first and second semiconductor lasers;
first and second optical waveguides connected to outputs of said first and second semiconductor lasers, respectively;
a multiplexer for multiplexing outputs of said first and second optical waveguides; and
a semiconductor optical amplifier adapted to receive output light from said multiplexer;
wherein said first semiconductor laser and respective core layers of said first optical waveguide and said multiplexer are optically connected to one another, and said second semiconductor laser and respective core layers of said second optical waveguide and said multiplexer are optically connected to one another;
wherein a first gate region is disposed between a MMI coupler (a) and a refractive index control core layer (b) in a front DBR region; and
wherein assuming that a band-gap value of the core layer of said semiconductor amplifier is $E_{SOA}$, an energy value of first signal light of said first semiconductor laser is $E_{SIG1}$, and a band-gap value of the core layer of said first region is $E_1$, a relation of $E_{SOA}>E_1$ is established so that the first core layer in said first region absorbs light from said semiconductor amplifier, and a relation of $E_{SIG1}>E_1$ is established and a current is applied to said first region so that said first core layer amplifies the first signal light.

2. The semiconductor laser apparatus according to claim 1, wherein a second gate region is disposed between a MMI coupler (c) and a refractive index control core layer (d) in the front DBR region;
wherein assuming that an energy value of second signal light of said second semiconductor laser is $E_{SIG2}$ and a band-gap value of the core layer in said second region is $E_2$, a relation of $E_{SOA}>E_2$ is established so that a second core layer of said second region absorbs light from said semiconductor amplifier and a relation of $E_{SIG2}>E_2$ is established and a current is applied to said second region so that said second core layer amplifies the second signal light; and
wherein when said first core layer amplifies said first signal light, said second layer absorbs light from said semiconductor amplifier, and when said second core layer amplifies said second signal light, said first core layer absorbs light from said semiconductor amplifier.

3. The semiconductor laser apparatus according to claim 2, wherein when signal light is generated in response to emitted light of said first semiconductor laser and the signal light based on said second semiconductor laser is stopped, control is made such that the signal light is transmitted through said first region and light from said semiconductor amplifier is absorbed at said second region.

4. The semiconductor laser apparatus according to claim 1, wherein said first and second semiconductor lasers are each a DBR laser.

5. The semiconductor laser apparatus according to claim 1, wherein said first and second semiconductor lasers, said first and second optical waveguides, said multiplexer and said semiconductor amplifier are integrated on the same substrate.

6. The semiconductor laser apparatus according to claim 2, wherein said substrate is set to a ground potential, a first electrode is disposed near said first region, and a second electrode is disposed near said second region.

7. The semiconductor laser apparatus according to claim 2, wherein said first and second core layers have each a multiple quantum wells layer or a bulk layer 8. The semiconductor laser apparatus according to claim 2, further comprising a third semiconductor laser and a third optical waveguide connected to an output of said third semiconductor laser, wherein said third semiconductor laser and respective core layers of said third optical waveguide and said multiplexer are optically connected to one another;
   wherein when signal light is generated in response to emitted light of said first semiconductor laser and signal light based on said second and third semiconductor lasers is stopped, the signal light is transmitted through said first region and light from said semiconductor amplifier is absorbed at said second and third regions;
   wherein when signal light is generated in response to emitted light of said second semiconductor laser and signal light based on said first and third semiconductor lasers is stopped, the signal light is transmitted through said second region and light from said semiconductor amplifier is absorbed at said first and third regions; and
   wherein when signal light is generated in response to emitted light of said third semiconductor laser and signal light based on said first and second semiconductor lasers is stopped, the signal light is transmitted through said third region and light from said semiconductor amplifier is absorbed at said first and second regions.

9. A semiconductor laser apparatus comprising:
   first and second semiconductor lasers;
   first and second optical waveguides connected to outputs of said first and second semiconductor lasers, respectively;
   a multiplexer for multiplexing outputs of said first and second optical waveguides; and
   a semiconductor optical amplifier adapted to receive output light from said multiplexer;
   wherein said first semiconductor laser and respective core layers of said first optical waveguide and said optical multiplexer are optically connected to one another, and said second semiconductor laser and respective core layers of said second optical waveguide and said multiplexer are optically connected to one another;
   wherein a first gate region is disposed between a MMI coupler (a) and a refractive index control core layer (b) in a front DBR region; and wherein assuming that a band-gap value of the core layer of said semiconductor amplifier is $E_{SOA}$, an energy value of first signal light of said first semiconductor laser is $E_{SIG1}$, and a band-gap value of the core layer of said first region is $E_1$, a relation of $E_{SOA} > E_1$ is established so that the first core layer in said first region absorbs light from said semiconductor amplifier, and a relation of $E_{SIG1} < E_1$ is established so that first signal light to passes through said first core layer.

10. The semiconductor laser apparatus according to claim 9,
    wherein a second gate region is disposed between a MMI coupler (c) and a refractive index control core layer (d) in the front DBR region;
    wherein assuming that an energy value of second signal light of said second semiconductor laser is $E_{SIG2}$ and a band-gap value of the core layer in said second region is $E_2$, a relation of $E_{SOA} > E_2$ is established so that a second core layer of said second region absorbs light from said semiconductor amplifier and a relation of $E_{SIG2} < E_2$ is established so that a second signal light is allowed to pass through said second core layer; and
    wherein when said first core layer amplifies said first signal light, said second layer absorbs light from said semiconductor amplifier, and when said second core layer amplifies said second signal light, said first core layer absorbs light from said semiconductor amplifier.

11. The semiconductor laser apparatus according to claim 10,
    wherein when signal light is generated in response to emitted light of said first semiconductor laser and the signal light based on said second semiconductor laser is stopped, control is made such that the signal light is transmitted through said first region and light from said semiconductor amplifier is absorbed at said second region.

12. The semiconductor laser apparatus according to claim 9,
    wherein said first and second semiconductor lasers are each a DBR laser.

13. The semiconductor laser apparatus according to claim 9,
    wherein said first and second semiconductor lasers, said first and second optical waveguides, said multiplexer and said semiconductor amplifier are integrated on the same substrate.

14. The semiconductor laser apparatus according to claim 10,
    wherein said substrate is set to a ground potential, the first power supply is disposed near said first region, and the second electrode is disposed near said second region.

15. The semiconductor laser apparatus according to claim 10,
    wherein said first and second core layers each have a multiple quantum wells layer or a bulk layer.

16. The semiconductor laser apparatus according to claim 10 further comprising a third semiconductor laser and a third optical waveguide connected to an output of said third semiconductor laser, wherein said third semiconductor laser and respective core layers of said third optical waveguide and said multiplexer are optically connected to one another;
    wherein when signal light is generated in response to emitted light of said first semiconductor laser and signal light based on said second and third semiconductor lasers is stopped, the signal light is transmitted through said first region and light from said semiconductor amplifier is absorbed at said second and third regions;
    wherein when signal light is generated in response to emitted light of said second semiconductor laser and signal light based on said first and third semiconductor lasers is stopped, the signal light is transmitted through said second region and light from said semiconductor amplifier is absorbed at said first and third regions; and
    wherein when signal light is generated in response to emitted light of said third semiconductor laser and signal light based on said first and second semiconductor lasers is stopped, the signal light is transmitted through said third region and light from said semiconductor amplifier is absorbed at said first and second regions.

* * * * *